(12) United States Patent
Wang et al.

(10) Patent No.: US 10,916,605 B2
(45) Date of Patent: Feb. 9, 2021

(54) DISPLAY SUBSTRATE, METHOD OF MANUFACTURING THE SAME, AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/393,895

(22) Filed: Apr. 24, 2019

(65) Prior Publication Data

US 2020/0091255 A1   Mar. 19, 2020

(30) Foreign Application Priority Data

Sep. 17, 2018   (CN) .......................... 2018 1 1081696

(51) Int. Cl.
| | | |
|---|---|---|
| *H01L 21/00* | (2006.01) | |
| *H01L 27/32* | (2006.01) | |
| *H01L 51/50* | (2006.01) | |

(52) U.S. Cl.
CPC ........ *H01L 27/3246* (2013.01); *H01L 27/322* (2013.01); *H01L 27/3262* (2013.01); *H01L 27/3265* (2013.01); *H01L 51/5012* (2013.01); *H01L 2227/323* (2013.01)

(58) Field of Classification Search
CPC .............. H01L 27/3246; H01L 27/322; H01L 27/3262
See application file for complete search history.

(56) References Cited

U.S. PATENT DOCUMENTS

| | | | |
|---|---|---|---|
| 9,373,649 B2 * | 6/2016 | Ning | H01L 29/7869 |
| 9,786,229 B2 | 10/2017 | Lee et al. | |
| 10,283,729 B2 | 5/2019 | Zhang et al. | |
| 10,541,380 B1 * | 1/2020 | Sung | H01L 21/76205 |
| 10,679,567 B2 | 6/2020 | Lee et al. | |

(Continued)

FOREIGN PATENT DOCUMENTS

| | | |
|---|---|---|
| CN | 104752485 A | 7/2015 |
| CN | 105097874 A | 11/2015 |
| CN | 107293554 A | 10/2017 |

OTHER PUBLICATIONS

Office Action issued in corresponding Chinese Patent Application No. 201811081696.X, dated Mar. 31, 2020.

*Primary Examiner* — Laura M Menz
(74) *Attorney, Agent, or Firm* — McDermott Will & Emery LLP

(57) ABSTRACT

A display substrate, a method of manufacturing the same and a display device are provided. The display substrate includes: a base substrate including an emission area and a transmission area; an electroluminescent device on the base substrate, the electroluminescent device including a first electrode in the emission area; a thin film transistor for controlling the electroluminescent device, the thin film transistor including an active layer; and a conductive member on the base substrate. The conductive member electrically connects the first electrode of the electroluminescent device with the active layer, the conductive member includes a contact portion in contact with the active layer, and the contact portion is located in the transmission area.

18 Claims, 9 Drawing Sheets

(56) References Cited

U.S. PATENT DOCUMENTS

| | | | |
|---|---|---|---|
| 2003/0030109 A1* | 2/2003 | Kimura | H01L 27/1222 257/359 |
| 2007/0075322 A1* | 4/2007 | Nakamura | H01L 27/1292 257/97 |
| 2015/0187279 A1 | 7/2015 | Lee et al. | |
| 2016/0035760 A1* | 2/2016 | Ning | H01L 27/1225 257/43 |
| 2016/0190224 A1* | 6/2016 | Kim | H01L 27/3265 257/40 |
| 2017/0117499 A1 | 4/2017 | Zhang et al. | |
| 2017/0287943 A1* | 10/2017 | Ma | H01L 29/66969 |
| 2018/0012551 A1 | 1/2018 | Lee et al. | |
| 2018/0068621 A1 | 3/2018 | Lee et al. | |
| 2020/0091255 A1* | 3/2020 | Wang | H01L 27/322 |

\* cited by examiner

DISPLAY SUBSTRATE, METHOD OF MANUFACTURING THE SAME, AND DISPLAY DEVICE

CROSS-REFERENCE TO RELATED APPLICATION

This application claims the benefit of Chinese Patent Application No. 201811081696.X filed on Sep. 17, 2018 in the State Intellectual Property Office of China, the whole disclosure of which is incorporated herein by reference.

TECHNICAL FIELD

The present disclosure relates to the field of display technologies, and in particular, to a display substrate, a method of manufacturing the display substrate, and a display device.

BACKGROUND

As an important member of flat panel displays, an electroluminescent device has received more and more attention from research personnel in the field of display technologies because it has advantages such as light weight, low cost, wide viewing angle, fast response, active illumination, high luminous brightness, high luminous efficiency, and full color display. Inorganic electroluminescent display and organic electroluminescent display have been widely used in the information display industry as typical representatives of the electroluminescent device. For example, OLED display devices of small or medium size have been widely used in portable devices such as mobile phones, pads and the like, and OLED display devices of large size have been widely used in televisions. In addition, with the development of the information society, novel display technologies such as transparent display devices have obtained a good user experience and have a broader market prospect.

However, a display substrate based on the electroluminescent device, the method of manufacturing the display substrate, and the display device including the display substrate need to be improved.

SUMMARY

In an aspect, a display substrate is provided including: a base substrate including an emission area and a transmission area; an electroluminescent device on the base substrate, the electroluminescent device including a first electrode in the emission area; a thin film transistor for controlling the electroluminescent device, the thin film transistor including an active layer; and a conductive member on the base substrate, wherein the conductive member electrically connects the first electrode of the electroluminescent device with the active layer, the conductive member includes a contact portion in contact with the active layer, and the contact portion is located in the transmission area.

Optionally, the display substrate further includes a pixel defining structure, wherein the pixel defining structure covers the contact portion.

Optionally, the active layer includes a channel portion, a first conductor portion and a second conductor portion, the first conductor portion and the second conductor portion are respectively positioned on opposite sides of the channel portion, an orthographic projection of each of the first conductor portion and the channel portion on the base substrate falls into the emission area, and an orthographic projection of a part of the second conductor portion proximal to the channel portion on the base substrate falls into the emission area, an orthographic projection of a part of the second conductor portion distal to the channel portion on the base substrate falls into the transmission area, and the conductive member is in contact with the part of the second conductor portion distal to the channel portion.

Optionally, the electroluminescent device further includes: a light-emitting layer on a side of the first electrode away from the base substrate; and a second electrode on a side of the light-emitting layer away from the first electrode, wherein the conductive member includes a conductive layer between the first electrode and the light-emitting layer.

Optionally, an orthographic projection of at least one of the light-emitting layer and the second electrode on the base substrate covers an orthographic projection of the conductive member on the base substrate.

Optionally, an orthographic projection of at least one of the light-emitting layer and the second electrode on the base substrate covers both the emission area and the transmission area.

Optionally, an orthographic projection of at least one of the light-emitting layer and the second electrode on the base substrate covers an orthographic projection of the pixel defining structure on the base substrate.

Optionally, an orthographic projection of the conductive member on the base substrate covers an orthographic projection of each of the first electrode and the thin film transistor on the base substrate.

Optionally, the thin film transistor further includes: a gate insulating layer on a side of the active layer away from the base substrate; a gate electrode on a side of the gate insulating layer away from the active layer; an interlayer dielectric layer on a side of the gate electrode away from the gate insulating layer; and a source electrode located on a side of the interlayer dielectric layer away from the gate electrode and electrically connected to the first conductor portion of the active layer, wherein an orthographic projection of each of the gate insulating layer, the gate electrode, the interlayer dielectric layer and the source electrode on the base substrate falls outside the transmission area.

Optionally, the display substrate further includes an insulating layer between the source electrode and the first electrode, wherein an orthographic projection of the insulating layer on the base substrate falls outside the transmission area.

Optionally, an area of an overlapped region between an orthographic projection of the insulating layer on the base substrate and an orthographic projection of the pixel defining layer on the base substrate is smaller than an area of an overlapped region between an orthographic projection of the interlayer dielectric layer on the base substrate and the orthographic projection of the pixel defining layer on the base substrate, and the area of the overlapped region between the orthographic projection of the interlayer dielectric layer on the base substrate and the orthographic projection of the pixel defining layer on the base substrate is smaller than an area of an overlapped region between an orthographic projection of the active layer on the base substrate and the orthographic projection of the pixel defining layer on the base substrate.

Optionally, the display substrate further includes a capacitor electrode, wherein the capacitor electrode is located in the same layer as the source electrode and spaced apart from the source electrode, and an orthographic projection of the capacitor electrode on the base substrate overlaps an orthographic projection of the second conductor portion on the base substrate.

Optionally, the conductive member includes transparent conductive material.

Optionally, the display substrate further includes a buffer layer between the base substrate and the active layer, wherein an orthographic projection of the buffer layer on the base substrate covers both the emission area and the transmission area.

In another aspect, a display device is provided including the display substrate as described above.

In a further aspect, a method of manufacturing a display substrate is provided including: providing a base substrate including an emission area and a transmission area; forming a thin film transistor on the base substrate, the thin film transistor including an active layer; forming a first electrode of an electroluminescent device in the emission area and on a side of the thin film transistor away from the base substrate; and forming a conductive member on the base substrate in such a way that the conductive member electrically connects the first electrode of the electroluminescent device with the active layer, wherein the conductive member includes a contact portion in contact with the active layer, and the contact portion is located in the transmission area.

Optionally, the method further includes: forming a pixel defining structure on the base substrate in such a way that the pixel defining structure covers the contact portion.

Optionally, forming the thin film transistor on the base substrate includes: forming the active layer of the thin film transistor on the base substrate, wherein the active layer includes a channel portion, a first conductor portion and a second conductor portion, the first conductor portion and the second conductor portion positioned on opposite sides of the channel portion, an orthographic projection of each of the first conductor portion and the channel portion on the base substrate falls into the emission area, and an orthographic projection of a part of the second conductor portion proximal to the channel portion on the base substrate falls into the emission area, an orthographic projection of a part of the second conductor portion distal to the channel portion on the base substrate falls into the transmission area, and the conductive member is in contact with the part of the second conductor portion distal to the channel portion.

Optionally, the method further includes: forming a light-emitting layer on a side of the conductive member away from the base substrate; and forming a second electrode on a side of the light-emitting layer away from the first electrode, wherein an orthographic projection of at least one of the light-emitting layer and the second electrode on the base substrate covers both the emission area and the transmission area.

Optionally, forming the thin film transistor on the base substrate further includes: forming a gate insulating layer on a side of the active layer away from the base substrate; forming a gate electrode on a side of the gate insulating layer away from the active layer; forming an interlayer dielectric layer on a side of the gate electrode away from the gate insulating layer; and depositing a metal layer on a side of the interlayer dielectric layer away from the gate electrode, and forming a source electrode and a capacitor electrode through a patterning process, wherein an orthographic projection of each of the gate insulating layer, the gate electrode, the interlayer dielectric layer, the source electrode and the capacitor electrode on the base substrate falls outside the transmission area.

DETAILED DESCRIPTION OF EMBODIMENTS

Figure 1:
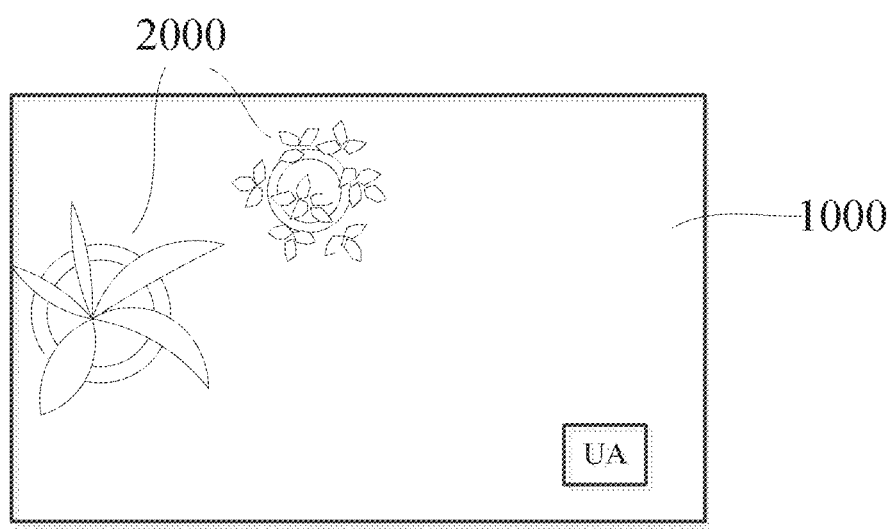
FIG. 1 is a view schematically showing a transparent display substrate.

Embodiments of the present disclosure will be described in detail below, and examples of the embodiments are illustrated in the accompanying drawings, wherein the same or similar reference numerals are used to refer to the same or similar elements or elements having the same or similar functions. The embodiments described below with reference to the accompanying drawings are intended to be only illustrative, and are not to be construed as limiting the present disclosure.

It is to be noted that a size and a thickness of each structure shown in the drawings are arbitrarily shown for better understanding and ease of description, but the present disclosure is not limited thereto. In the drawings, for example, the thickness of layers, films, panels, regions and the like are exaggerated for clarity.

In descriptions of the present disclosure, orientational or positional relationships indicated by terms such as "upper", "lower" and the like are based on the orientational or positional relationships shown in the drawings, and are merely for the convenience of describing the present disclosure and do not require that the present disclosure must be constructed and operated in particular orientations, thus they are not to be construed as limiting the present disclosure.

In the descriptions of the present specification, descriptions referring to terms such as "one embodiment", "another embodiment" and the like mean that specific features, structures, materials or characteristics described in connection with the embodiment are included in at least one embodiment of the present disclosure. In the present specification, illustrative descriptions on the above terms are not necessarily directed to the same embodiment or example. Furthermore, the specific features, structures, materials, or characteristics may be combined in a suitable manner in any one or more embodiments or examples. In addition, various embodiments or examples described in the specification and features in various embodiments or examples may be combined and grouped without departing from the scope of the present disclosure. In addition, it should be noted that in the present specification, terms such as "first" and "second" are used for descriptive purposes only, and are not to be construed as indicating or implying a relative importance or implicitly indicating the number of indicated technical features.

As used herein, an expression "transmission area" refers to an area through which light may be substantially transmitted. For example, for a display substrate or display panel, its "transmission area" may refer to an area, through which external light may be substantially transmitted, on the display substrate or display panel. Due to the transmission area, the user may observe an object at a back side (a side away from the user) of the display substrate or the display panel. For example, the "transmission area" typically includes a transparent material layer or a transparent member. Further, an expression "emission area" refers to an area from which light is emitted. For example, for a display substrate or a display panel, its "emission area" refers to an area, from which light is emitted, on the display substrate or display panel, for example, an area where an electroluminescent device is located.

Through intense researches and a large number of experiments, the inventors have found that a transparent display substrate manufactured based on an electroluminescent device generally has problems such as low transparency and poor luminous efficiency. Specifically, there is competition between the transparency of the transparent display substrate and the substrate design, so that the transparency of the transparent display substrate may be increased only by reducing an light-emitting area, that is, the transparency is increased at the expense of reducing the luminous efficiency, and vice versa, the light-emitting area and the light-emitting efficiency may be ensured while the transparency of the transparent display substrate is low, so that a good transparency effect cannot be achieved.

FIG. 1 is a view schematically showing a transparent display substrate. Referring to FIG. 1, a display substrate 1000 may have transparent properties and allow an object or a background (such as plant 2000 shown in FIG. 1) positioned behind the display substrate 1000 to be visible. This display substrate 1000 is referred to as a transparent display. The transparent display may be utilized, for example, as a showcase, glass of an automobile, and a window of a building for transmitting detail information and a function of a product to be utilized to provide various information. The transparent display may be applied to various objects, and may be combined with content that is interactive with the objects. For example, the transparent display may be combined with an augmented reality technology.

Figure 2:
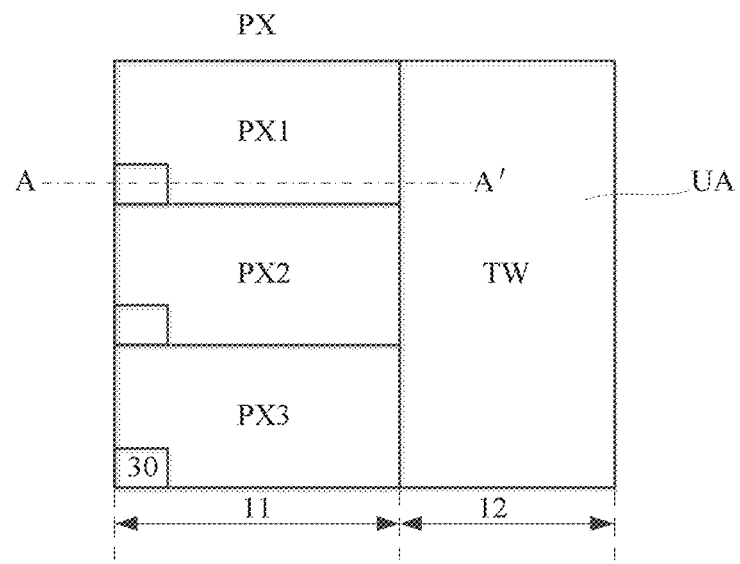
FIG. 2 is a layout view schematically showing a unit area of a display substrate according to some exemplary embodiments of the present disclosure.

FIG. 2 is a layout view schematically showing a unit area of a display substrate according to some exemplary embodiments of the present disclosure. Referring to FIG. 2, the display substrate may include a transmission area 12 and an emission are 11. For example, the transmission area 12 and the emission area 11 may be alternately disposed in a horizontal direction and/or a vertical direction. As shown in FIG. 2, a transmission window TW substantially transmitting external light is positioned in the transmission area 12, and a pixel PX as a minimum unit displaying an image is positioned in the emission area 11. In the display substrate, a unit area UA, for example including one pixel PX and one transmission window TW, may be disposed in a matrix form. Due to the transmission window TW of the transmission area 12, the display substrate 1000 may be substantially or entirely recognized to be transparent.

The pixel PX may include a first pixel PX1, a second pixel PX2, and a third pixel PX3. The first pixel PX1, the second pixel PX2, and the third pixel PX3 may display different colors. For example, the first pixel PX1 may display red, the second pixel PX2 may display green, and the third pixel PX3 may display blue. The pixel PX may express various colors and contrast ratios by a combination of the first pixel PX1, the second pixel PX2, and the third pixel PX3. In other embodiments, the pixel PX may further include a pixel displaying another color (e.g., white). It is to be understood by those skilled in the art that the first pixel PX1, the second pixel PX2, and the third pixel PX3 may be referred to as subpixels.

In the embodiment shown in FIG. 2, the first pixel PX1, the second pixel PX2, and the third pixel PX3 have substantially the same size, but the embodiments of the present disclosure are not limited thereto, and the first pixel PX1, the second pixel PX2, and the third pixel PX3 may have different sizes. Various changes can be made to the sizes of the first pixel PX1, the second pixel PX2, and the third pixel PX3. Furthermore, the sizes of at least two of the first pixel PX1, the second pixel PX2, and the third pixel PX3 may be substantially the same.

Each of the pixels PX1, PX2, and PX3 includes a thin film transistor 30, for example, for controlling or turning on/off current flowing to the pixel. Although one thin film transistor 30 is shown, each pixel PX may include two or more thin film transistors 30. Furthermore, each of the pixels PX1, PX2, and PX3 may include at least one capacitor (shown in FIG. 3).

The transmission window TW minimizes a loss of transmittance and transmits external light. The transmission window TW may have a plane shape of a quadrangle, but it is not limited thereto. In FIG. 2, one transmission window TW is adjacent to the pixel PX to correspond to one pixel PX. Alternatively, the transmission window TW may be divided into three transmission windows, so that the three transmission windows may be respectively positioned adjacent to the first pixel PX1, the second pixel PX2, and the third pixel PX3 to correspond to the pixels PX1, PX2, and PX3 respectively. In other embodiments, the transmission window TW may be respectively positioned adjacent to four or more pixels to correspond to these pixels respectively. A wire (such as scan line for transmitting scan signal) for transmitting signal applied to the pixel PX may be positioned between transmission windows TW adjacent in the vertical direction.

Figure 3:
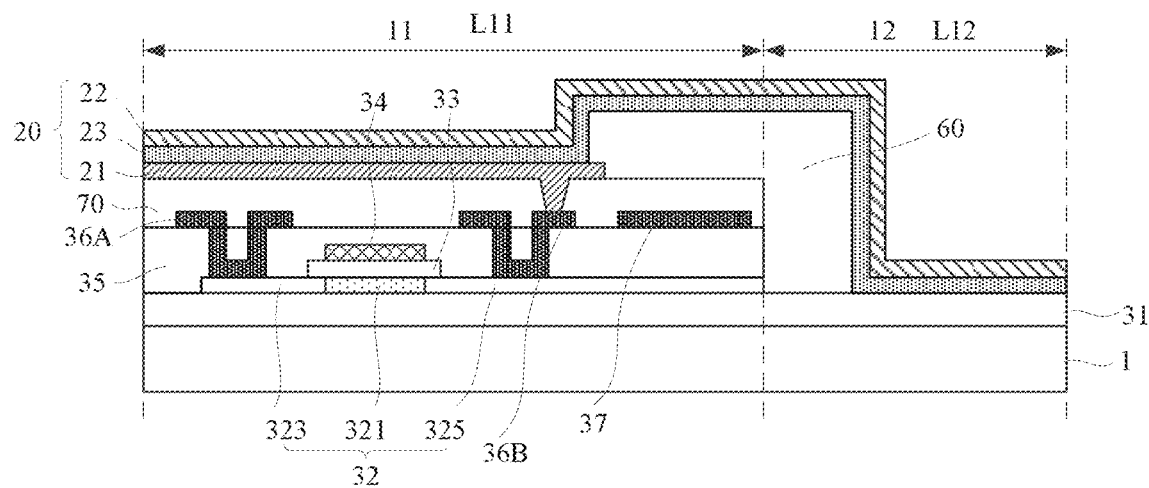
FIG. 3 is a schematic cross-sectional view taken along line AA' in FIG. 2.

FIG. 3 is a schematic cross-sectional view taken along line AA' in FIG. 2. Referring to FIGS. 2 and 3, the display substrate may include a base substrate 1, an electroluminescent device 20, a thin film transistor 30, and a pixel defining structure 60 and the like. The base substrate 1 includes an emission area 11 and a transmission area 12. The transmission window TW may be located in the transmission area 12 of the base substrate 1. The electroluminescent device 20 and its driving devices (including the thin film transistor 30, capacitor, etc.) may be disposed in the emission area 11 of the base substrate 1.

The base substrate 1 may be a transparent insulating substrate made of glass, quartz, ceramic, plastic, or the like.

The thin film transistor 30 may include an active layer 32, a gate insulating layer 33, a gate electrode 34, a source electrode 36A, and a drain electrode 36B.

The active layer 32 of the thin film transistor 30 is located on the base substrate 1. The active layer 32 includes a channel portion 321 and conductor portions 323, 325 on opposite sides of the channel portion 321, wherein the conductor portion 323 may be referred to as a first conductor portion and the conductor portion 325 may be referred to as a second conductor portion. The channel portion 321 may include amorphous silicon, polycrystalline silicon, or an oxide semiconductor, and the conductor portions 323, 325 are formed by performing a conductor treatment (for example, doping) on amorphous silicon, polycrystalline silicon, or oxide semiconductor.

A buffer layer 31 may be disposed between the base substrate 1 and the active layer 32 for preventing diffusion of impurities and moisture permeation which otherwise cause deterioration of semiconductor characteristics. For example, the buffer layer 31 may cover both the emission area 11 and the transmission area 12.

The gate insulating layer 33 may be disposed on a side of the channel portion 32 away from the buffer layer 310, and the gate electrode 34 is disposed on a side of the gate insulating layer 33 away from the channel portion 321. The gate electrode 34 may be disposed corresponding to the channel portion 321. An interlayer dielectric layer 35 is disposed on a side of the gate electrode 34 away from the gate insulating layer 33, and the interlayer dielectric layer 35 has via holes. The source electrode 36A and the drain electrode 36B are disposed on a side of the interlayer dielectric layer 35 away from the gate electrode 34, and are respectively electrically connected to the active layer through conductive plugs formed in the via holes of the interlayer dielectric layer 35, for example, the source electrode 36A is electrically connected to the conductor portion 323, and the drain electrode 36B is electrically connected to the conductor portion 325.

A capacitor electrode 37 is disposed in the same material and the same layer as the source/drain electrodes, and spaced apart from the source/drain electrodes, so that the capacitor electrode 37 and the source/drain electrodes may be formed through the same one patterning process, which further simplifies the manufacturing process. It should be noted that the capacitor electrode 37 may overlap the conductor portion 325 to form a capacitor, thereby further improving the performance of the display substrate.

An insulating layer 70 is disposed on a side of both the source/drain electrodes and the capacitor electrode 37 away from the interlayer dielectric layer 35. The insulating layer 70 may further include a passivation layer and a planarization layer, for example, the passivation layer may be disposed on a side of the source/drain electrodes away from the interlayer dielectric layer 35, and the planarization layer may be disposed on a side of the passivation layer away from the source/drain electrodes.

In the illustrated embodiment, the thin film transistor 30 may be a drive transistor for a pixel of an organic light emitting diode display. Since the gate electrode 34 is located above the active layer 32, the thin film transistor 30 may be referred to as a top gate thin film transistor. However, the structure of the thin film transistor 30 is not limited thereto, and various changes can be made, for example, it may be a bottom gate thin film transistor in which the gate electrode is located below the active layer.

The electroluminescent device 20 may include a first electrode 21, a light-emitting layer 23, and a second electrode 22 which are sequentially disposed on the base substrate 1. As shown in FIG. 3, the first electrode 21 is disposed on a side of the insulating layer 70 away from the base substrate 1, the second electrode 22 is disposed on a side of the first electrode 21 away from the base substrate 1, and the light-emitting layer 23 is sandwiched between the first electrode 21 and the second electrode 22. For example, the first electrode 21 may be an anode and the second electrode 22 may be a cathode. In other embodiments, the first electrode 21 may be a cathode and the second electrode 22 may be an anode.

According to some embodiments of the present disclosure, specific types of the electroluminescent device 20, as well as materials, specific shapes, and thicknesses of the structures of all the first electrode 21, the second electrode 22, and the light-emitting layer 23 of the electroluminescent device 20 are not particularly limited, and they may be selected by those skilled in the art according to actual conditions. For example, the first electrode 21 may be formed of a reflective metal, and the second electrode 22 and the light-emitting layer 23 may be formed of a transparent material.

As shown in FIG. 3, the pixel defining structure 60 may function to delimit a pixel. Optionally, the pixel defining structure 60 is not located in the transmission window TW of the transmission area 12, thereby helping to increase the transparency of the transmission window TW and improving the overall transparency of the display substrate.

In the exemplary embodiment shown in FIG. 3, among several layers located in the emission area 11, the buffer layer 31, the light-emitting layer 23, and the second electrode 22 may be further located in the transmission area 12, however, all of the active layer 32, the gate insulating layer 33, the gate electrode 34, the interlayer dielectric layer 35, the source/drain electrodes, the capacitor electrode 37, the insulating layer 70, and the first electrode 21 are not located in the transmission area 12. Therefore, the transmission window TW may transmit external light with high transmittance. In this way, the transparency of the transparent display substrate may be improved.

Figure 4:
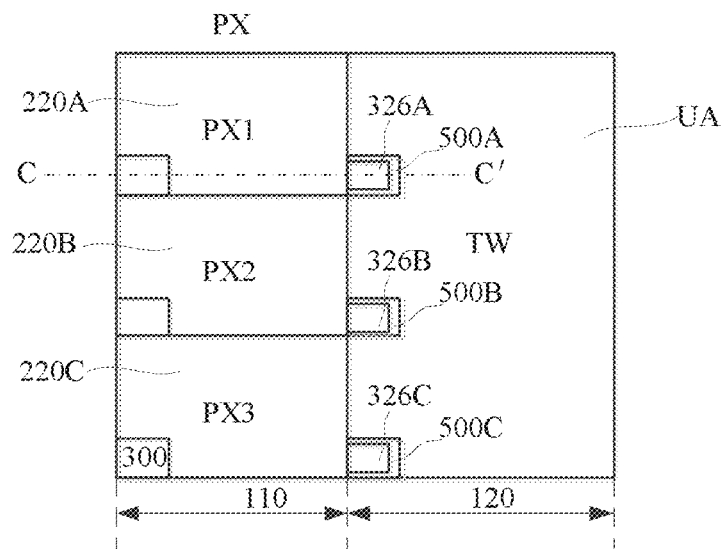
FIG. 4 is a layout view schematically showing a unit area of a display substrate according to some other exemplary embodiments of the present disclosure.

FIG. 4 is a layout view schematically showing a unit area of a display substrate according to some other exemplary embodiments of the present disclosure. Referring to FIG. 4, the display substrate may include a transmission area 120 and an emission are 110. For example, the transmission area 120 and the emission area 110 may be alternately disposed in a horizontal direction and/or a vertical direction. As shown in FIG. 4, a transmission window TW substantially transmitting external light is positioned in the transmission area 120, and a pixel PX as a minimum unit displaying an image is positioned in the emission area 110. In the display substrate, a unit area UA, for example including one pixel PX and one transmission window TW, may be disposed in a matrix form. Due to the transmission window TW of the transmission area 120, the display substrate may be substantially or entirely recognized to be transparent.

The pixel PX may include a first pixel PX1, a second pixel PX2, and a third pixel PX3. The first pixel PX1, the second pixel PX2, and the third pixel PX3 may display different colors. For example, the first pixel PX1 may display red, the second pixel PX2 may display green, and the third pixel PX3 may display blue. The pixel PX may express various colors and contrast ratios by a combination of the first pixel PX1, the second pixel PX2, and the third pixel PX3. In other embodiments, the pixel PX may further include a pixel displaying another color (e.g., white). It is to be understood by those skilled in the art that the first pixel PX1, the second pixel PX2, and the third pixel PX3 may be referred to as subpixels.

In the embodiment shown in FIG. 4, the first pixel PX1, the second pixel PX2, and the third pixel PX3 have substantially the same size, but the embodiments of the present disclosure are not limited thereto, and the first pixel PX1, the second pixel PX2, and the third pixel PX3 may have different sizes. Various changes can be made to the sizes of the first pixel PX1, the second pixel PX2, and the third pixel PX3. Furthermore, the sizes of at least two of the first pixel PX1, the second pixel PX2, and the third pixel PX3 may be substantially the same.

Each of the pixels PX1, PX2, and PX3 includes a thin film transistor 300, for example, for controlling or turning on/off a current to the pixel. Although one thin film transistor 300 is shown, each pixel PX may include two or more thin film transistors 300. Furthermore, each of the pixels PX1, PX2, and PX3 may include at least one capacitor (shown in FIG. 5).

The transmission window TW minimizes a loss of transmittance and transmits external light. The transmission window TW may have a plane shape of a quadrangle, but it is not limited thereto. In FIG. 4, one transmission window TW is adjacent to the pixel PX to correspond to one pixel PX. Alternatively, the transmission window TW may be divided into three transmission windows, so that the three transmission windows may be respectively positioned adjacent to the first pixel PX1, the second pixel PX2, and the third pixel PX3 to correspond to the pixels PX1, PX2, and PX3 respectively. In other embodiments, the transmission window TW may be respectively positioned adjacent to four or more pixels to correspond to these pixels respectively. A wire (such as scan line for transmitting scan signal) for transmitting signal applied to the pixel PX may be positioned between transmission windows TW adjacent in the vertical direction.

Figure 5:
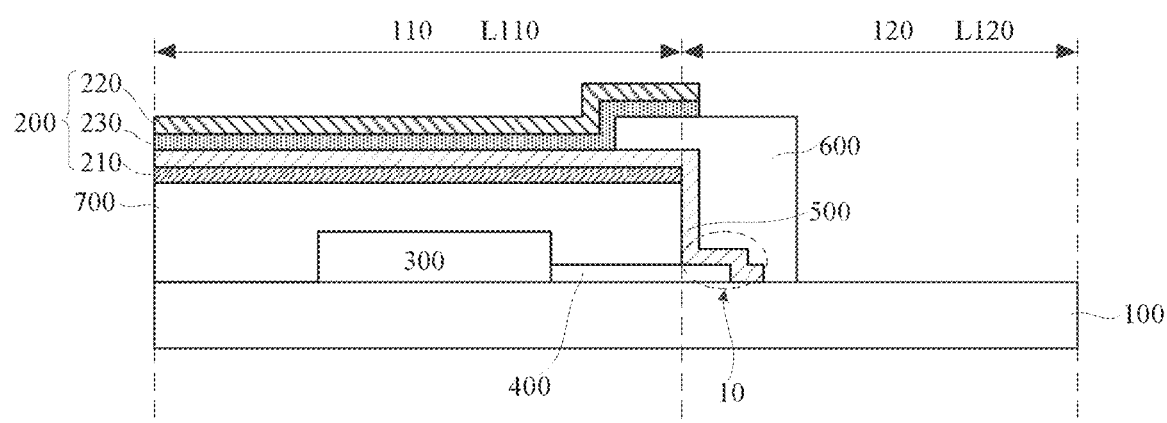
FIG. 5 is a schematic cross-sectional view taken along line CC' in FIG. 4.

FIG. 5 is a schematic cross-sectional view taken along line CC' in FIG. 4. Referring to FIGS. 4 and 5, the display substrate includes a base substrate 100, an electroluminescent device 200, a thin film transistor 300, a conductive member 500, and a pixel defining structure 600. The electroluminescent device 200, the pixel defining structure 600 and the thin film transistors 300 for controlling the electroluminescent device 200 are all disposed on the base substrate 100.

As shown in FIG. 5, the conductive member 500 is disposed on the base substrate 100 for electrically connecting an electrode 210 of the electroluminescent device 200 with an active layer of the thin film transistor 300. Specifically, a first end of the conductive member 500 is electrically connected to the electrode 210 of the electroluminescent device 200, and a second end is electrically connected to the active layer of the thin film transistor 300. For example, the first end of the conductive member 500 contacts the electrode 210 of the electroluminescent device 200, and the second end of the conductive member 500 contacts the active layer of the thin film transistor 300. As shown in FIG. 5, a portion, which contacts the active layer of the thin film transistor 300, of the conductive member 500 is referred to as a contact portion 10, and the contact portion 10 may be located in the transmission area 120. Further, the contact portion 10 is covered by the pixel defining structure 600, that is, an orthographic projection of the pixel defining structure 600 on the base substrate 100 covers an orthographic projection of the contact portion 10 on the base substrate 100.

Referring back to FIGS. 2 and 3, the drain electrode 36B is electrically connected to the active layer 32 through a conductive plug formed in a via hole of the interlayer dielectric layer 35, and the first electrode 21 is electrically connected to the drain electrode 36B through a conductive plug formed in a via hole of the insulating layer 70. In this manner, the first electrode 21 is electrically connected to the active layer 32, thereby achieving electrical connection between the electroluminescent device and the thin film transistor. It is necessary to individually form via holes in the interlayer dielectric layer 35 and the insulating layer 70, resulting in a complicated manufacturing process. Moreover, a space is required to arrange the structures such as via holes, resulting in a large size (for example, a dimension L11 in FIG. 3) of the emission area 11, and accordingly, resulting in a small size (for example, a dimension L12 in FIG. 3) of the transmission area 12, thus it is not conducive to improve the transparency of the display substrate. Referring to FIGS. 4 and 5, the electrical connection between the electroluminescent device and the thin film transistor can be realized without etching out the via holes, so that the manufacturing process may be simplified. Further, no space is required to arrange the structures such as via holes, and the contact portion 10 itself has a large transparency, thus, in the embodiment shown in FIGS. 4 and 5, the size (for example, a dimension L110 in FIG. 5) of the emission area 110 is reduced, and accordingly, the size (for example, a dimension L120 in FIG. 5) of the transmission area 120 is increased, thereby improving the transparency of the display substrate. It is to be noted that, in the embodiment shown in FIGS. 4 and 5, although the size of the emission area 110 is reduced, a light-emitting area of the emission area 110 is not reduced, so that the display substrate still has a large aperture ratio. That is, in the embodiment shown in FIGS. 4 and 5, both the transparency and luminous efficiency of the display substrate are taken into consideration, thereby further improving the market competitiveness of the product.

With thither reference to FIG. 5, the display substrate may further include an insulating layer 700 disposed between the electroluminescent device 200 and the thin film transistor 300. The electroluminescent device 200 may include the first electrode 210, a light-emitting layer 230, and a second electrode 220 that are sequentially disposed on the base substrate 100. According to some embodiments of the present disclosure, specific types of the thin film transistor 300 are not particularly limited, and may include, for example, a top gate or a bottom gate thin film transistor. Specific processes of forming the thin film transistor 300 are not particularly limited. For example, the thin film transistor 300 may be formed by a back channel etching (BCE) process or an etch stop layer (ESL) process.

Hereinafter, the display substrate according to some embodiments of the present disclosure will be described by taking a top gate thin film transistor as an example. The thin film transistor 300 further includes an active layer, a gate electrode, and source/drain electrodes. In the embodiments of the present disclosure, materials, specific shapes, and thicknesses of the structures of all the insulating layer 700, the first electrode 210, the light-emitting layer 230, the second electrode 220, the active layer, the gate electrode, and the source/drain electrodes are not particularly limited, and they may be selected by those skilled in the art according to actual conditions.

Figure 6:
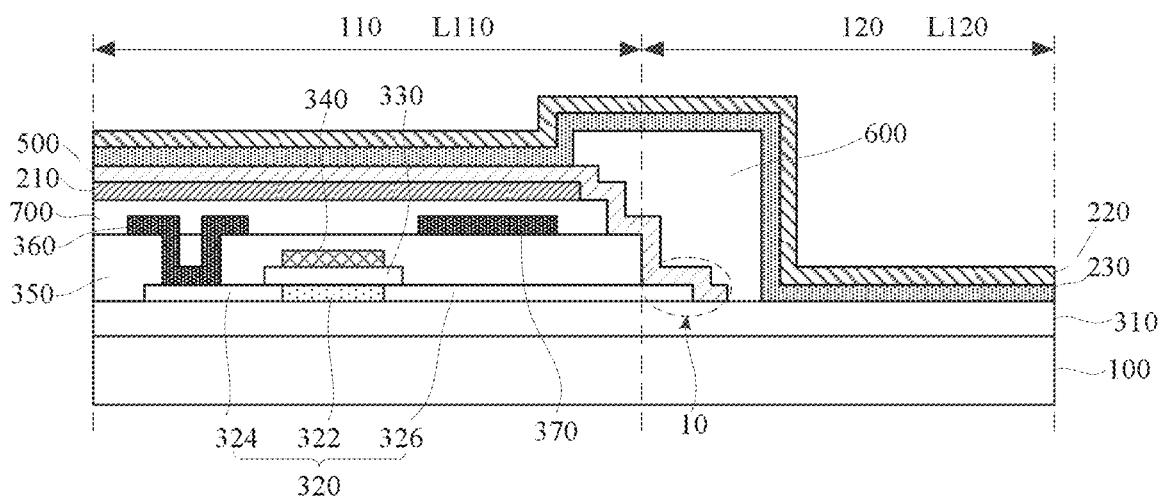
FIG. 6 a schematic cross-sectional view further showing a section taken along line CC' in FIG. 4.

For example, FIG. 6 further shows a schematic cross-sectional view taken along line CC' in FIG. 4. Referring to FIG. 6, the light-emitting layer 230 of the electroluminescent device 200 may be formed of an organic electroluminescent material, and the thin film transistor 300 may be a top gate thin film transistor. That is, the active layer 320 may include a channel portion 322 and conductor portions 324, 326 on opposite sides of the channel portion 322, and the gate electrode 340 may be located above the active layer 320 of the thin film transistor 300 and correspond to the channel portion 322 of the active layer. In particular, the conductor portion 324 may be referred to as a first conductor portion and the conductor portion 326 may be referred to as a second conductor portion. An orthographic projection of each of the conductor portion 324 and the channel portion 322 on the base substrate 100 falls into the emission area 110, an orthographic projection of a part of the conductor portion 326 proximal to the channel portion 322 on the base substrate 100 falls into the emission area 110, and an orthographic projection of a part of the conductor portion 326 distal to the channel portion 322 on the base substrate 100 falls into the transmission area 120. The source electrode 360 may be electrically connected to the conductor portion 324 of the active layer so as to be electrically connected to the channel portion 322. The conductive member 500 contacts the part of the conductor portion 326 distal to the channel portion 322 so as to be electrically connected to the active layer.

Referring to FIG. 6, the active layer of the thin film transistor 300 is electrically connected to the conductive member 500, more specifically, the conductor portion 326 of the active layer contacts the conductive member 500. For example, in order that the conductor portion 326 of the active layer contacts the conductive member 500, the conductive member 500 may directly cover the conductor portion 326, that is, all film layers between the conductor portion 326 and the conductive member 500 are not provided with any via hole for connecting the conductor portion 326 with the conductive member 500. Therefore, the electrical connection between the electroluminescent device 200 and the thin film transistor 300 may be easily realized, and the manufacturing process is simplified, and it is not necessary to etch out the via holes to realize the electrical connection between the electroluminescent device and the thin film transistor, thereby avoiding a low transparency due to a connection manner through via holes. Moreover, the pixel defining structure 600 of the display substrate covers the contact portion 10, that is, the contact portion 10 is not disposed in the emission area where the pixel structure is located, and thus does not affect the aperture ratio of the display substrate.

As shown in FIGS. 5 and 6, the pixel defining structure 600 is not located in the transmission window TW of the transmission area 120, thereby helping to increase the transparency of the transmission window TW and improving the overall transparency of the display substrate. Moreover, among several layers located in the emission area 110, only the buffer layer 310, the light-emitting layer 230, and the second electrode 220 are further located in the transmission window TW of the transmission area 120, all of the active layer 320, the gate insulating layer 330, the gate electrode 340, the interlayer dielectric layer 350, the capacitor electrode 370, the insulating layer 700, and the first electrode 210 are not located in the transmission window TW of the transmission area 120. Therefore, the transmission window TW can transmit external light with high transmittance.

According to the embodiments of the present disclosure, when the display substrate based on the electroluminescent device is applied into a display device, specific types of the display device are not particularly limited, and they may be selected by those skilled in the art according to actual needs. For example, the display substrate may be applied into an OLED or inorganic electroluminescent display device (e.g., quantum dot luminescent device). According to some specific embodiments of the present disclosure, the display substrate may be applied into an OLED display device of large size.

Various structures of the display substrate will be described in detail below by taking the display substrate for an OLED display device as an example. More specifically, the OLED display substrate may be an active matrix organic light emitting diode (AMOLED) display substrate.

According to some embodiments of the present disclosure, specific materials for forming the base substrate 100 are not particularly limited, and they may be selected by those skilled in the art according to actual conditions, as long as the materials have a certain mechanical strength, and may provide sufficient support for other structures constituting the display substrate.

Referring to FIG. 6, the thin film transistor 300 further includes a buffer layer 310, an active layer 320, a gate insulating layer 330, a gate electrode 340, an interlayer dielectric layer 350, a source electrode 360, a capacitor electrode 370, and an insulating layer 700.

The buffer layer 310 is disposed on the base substrate 100 and covers the transmission area 120. The active layer 320 is disposed on a side of the buffer layer 310 away from the base substrate 100 and covers a portion of the buffer layer 310 in the transmission area 120.

The active layer 320 includes a channel portion 322 and conductor portions 324, 326 on opposite sides of the channel portion 322. The conductive member 500 contacts the conductor portion 326 and covers a part of the conductor portion 326 distal to the channel portion 322. That is, both the channel portion 322 of the active layer and the conductor portions 324, 326 of the active layer are disposed in the same layer, and the conductor portions 324, 326 may be formed of a conductive active layer material (e.g., indium gallium zinc oxide). Specifically, an active layer material may be firstly formed on the base substrate 100 in such a way that the active layer material may cover a portion of the transmission area 120, and then the active layer material on opposite sides may be converted into a conductor so as to form the conductor portions 324, 326 while the active layer material which is not converted into a conductor constitutes the channel portion 322, in this way, the active layer 320 including the channel portion 322 and the conductor portions 324, 326 is formed. The conductor portion 326 may electrically connect the channel portion 322 with the conductive member 500, and the conductor portion 324 may electrically connect the channel portion 322 with the source electrode 360. Thereby, the channel portion 322 of the active layer and the conductor portions 324, 326 of the active layer may be easily formed, which further simplifies the manufacturing process and improves production efficiency.

The gate insulating layer 330 is disposed on a side of the channel portion 322 away from the buffer layer 310, and the gate electrode 340 is disposed on a side of the gate insulating layer 330 away from the channel portion 322. That is, the gate electrode 340 may be disposed corresponding to the channel portion 322. According to some embodiments of the present disclosure, the interlayer dielectric layer 350 is disposed on a side of the gate electrode 340 away from the gate insulating layer 330, and the interlayer dielectric layer 350 has a via hole. According to some embodiments of the present disclosure, the source electrode 360 is disposed on a side of the interlayer dielectric layer 350 away from the gate electrode 340, and is electrically connected to the active layer 320 through a conductive plug formed in the via hole of the interlayer dielectric layer 350. That is to say, the source electrode 360 may be electrically connected to the conductor portion 324 away from the transmission area 120 through the conductive plug, so as to be electrically connected to the channel portion 322.

The capacitor electrode 370 and the source electrode 360 are disposed in the same material and spaced apart from each other. Thereby, the capacitor electrode 370 and the source electrode 360 may be formed through the same one patterning process, which further simplifies the manufacturing process. As shown in FIG. 6, the capacitor electrode 370 may overlap the conductor portion 326, that is, an orthographic projection of the capacitor electrode 370 on the base substrate 100 overlaps an orthographic portion of the conductor portion 326 on the base substrate 100 to form a capacitor, thereby further improving the performance of the display substrate.

The insulating layer 700 is disposed on a side of the source electrode 360 and the capacitor electrode 370 away from the interlayer dielectric layer 350. The insulating layer 700 may further include a passivation layer and a planarization layer. The passivation layer may be disposed on a side of the source electrode 360 away from the interlayer dielectric layer 350, and the planarization layer may be disposed on a side of the passivation layer away from the source electrode 360.

In the structures of the thin film transistor 300 as described above, the structure of the transmission area 120 is further simplified, specifically, the inorganic and organic insulating mediums in the transmission area 120, such as the interlayer dielectric layer 350 and the insulating layer 700 (including the passivation layer and the planarization layer), are removed, thereby helping to increase the transparency of the transmission area and further increasing the transparency of the display substrate. Thus, the display substrate is advantageously applied into a transparent display device.

Referring to FIG. 6, areas of overlapped regions between orthographic projections of the insulating layer 700, the interlayer dielectric layer 350, and the active layer 320 on the base substrate 100 and an orthographic projection of the pixel defining layer 600 on the base substrate 100 may be gradually increased. That is, an area of an overlapped region between the orthographic projection of the insulating layer 700 on the base substrate 100 and the orthographic projection of the pixel defining layer 600 on the base substrate 100 is less than an area of an overlapped region between the orthographic projection of the interlayer dielectric layer 350 on the base substrate 100 and the orthographic projection of the pixel defining layer 600 on the base substrate 100; and the area of the overlapped region between the orthographic projection of the interlayer dielectric layer 350 on the base substrate 100 and the orthographic projection of the pixel defining layer 600 on the base substrate 100 is less than an area of an overlapped region between the orthographic projection of the active layer on the base substrate 100 and the orthographic projection of the pixel defining layer 600 on the base substrate 100. In this way; a stepped structure may be formed so that the conductor portion 326 of the active layer is exposed. The exposed conductor portion 326 covers a portion of the transmission area 120 and is electrically connected to the conductive member 500.

According to some embodiments of the present disclosure, both specific types of the thin film transistor 300, and materials, specific shapes, and thicknesses of the buffer layer 310, the active layer, the gate insulating layer 330, the gate electrode 340, the interlayer dielectric layer 350, the source electrode 360, the capacitor electrode 370 and the insulating layer 700 of the thin film transistor 300 are not particularly limited, and they may be selected by those skilled in the art according to actual conditions. For example, the channel portion 322 of the active layer may be formed of at least one of a-IGZO, ZnON, IZTO, a-Si, p-Si, sexithiophene or polythiophene; the buffer layer 310, the gate insulating layer 330, the interlayer dielectric layer 350, the passivation layer of the insulating layer 700 may be respectively formed of at least one of $SiO_x$, $SiN_x$, SiON, $AlO_x$, $HfO_x$, or $TaO_x$; and the planarization layer of the insulating layer 700 may be formed of at least one of material of polysiloxane type, material of acryl type or material of polyimide type.

Referring to FIG. 6, the electroluminescent device 200 includes a first electrode 210, a light-emitting layer 230, and a second electrode 220 which are sequentially disposed on the base substrate 100. For example, each of the second electrode 220 and the light-emitting layer 230 may cover both the emission area 110 and the transmission area 120. In this way, both an entire layer of the light-emitting layer and an entire layer of the second electrode may be formed on the base substrate 100 by using an open mask, and it is not necessary to use a mask of complicated structure such as FMM to form the light-emitting layer and the second electrode, thereby facilitating manufacturing the display substrate.

As shown in FIG. 6, the first electrode 210 is disposed on a side of the insulating layer 700 away from the base substrate 100, and the conductive member 500 is disposed on a side of the first electrode 210 away from the insulating layer 700, covers a portion of the transmission area 120, and contacts the conductor portion 326 in the transmission area 120. That is, the conductive member 500 includes a conductive layer between the first electrode 210 and the light-emitting layer 230, and the first electrode 210 is electrically connected to the conductive member 500. Further, the first electrode 210 may be electrically connected to the conductor portion 326 through the conductive member 500, and thus electrically connected to the channel portion 322 of the active layer.

As shown in FIG. 6, the pixel defining structure 600 covers both the conductive member 500 and the conductor portion 326 in the transmission area 120. According to some embodiments of the present disclosure, the light-emitting layer 230 covers the conductive member 500, the pixel defining structure 600, and the buffer layer 310 located in the transmission area 120, that is, the light-emitting layer 230 is formed both in the emission area 110 and in the transmission area 120.

As shown in FIG. 6, the second electrode 220 is disposed on a side of the light-emitting layer 230 away from the base substrate 100, and the second electrode 220 may cover the transmission area 120. It should be noted that the transparency of each of the light-emitting layer 230 and the second electrode 220 is large, thus, when both the light-emitting layer 230 and the second electrode 220 cover the transmission area 120, the transparency of the transmission area 120 is not substantially affected and the overall uniformity of the display substrate may be improved. The pixel defining structure 600 may function to delimit a pixel. Moreover, the pixel defining structure 600 covers only the conductor portion 326 and the conductive member 500 in the transmission area 120, and unnecessary pixel defining structure 600 in the other part of the transmission area 120 is removed, thereby further simplifying the structure of the transmission area 120, and contributing to increasing the transparency of the transmission area 120 and further increasing the transparency of the display substrate.

According to some embodiments of the present disclosure, specific types of the electroluminescent device 200 as well as materials, specific shapes, and thicknesses of all the first electrode 210, the second electrode 220, and the light-emitting layer 230 of the electroluminescent device 200 are not particularly limited, and they may be selected by those skilled in the art according to actual conditions. For example, the first electrode 210 may be formed of a reflective metal. More specifically, the first electrode 210, the second electrode 220, the source electrode 360, and the capacitor electrode 370 may be respectively formed of a common metal such as Ag, Cu, Al, Mo, or a multilayer metal such as MoNb/Cu/MoNb, or an alloy material such as AlNd, MoNb, or a stacked structure such as Mo/AlNd/ITO, ITO/Ag/ITO, which is formed of a metal and a transparent conductive oxide such as ITO, AZO. According to some embodiments of the present disclosure, the conductive member 500 may be formed of a transparent conductive material. Thereby, the transparent conductive material does not affect the display effect, and the performance of the display substrate is further improved. According to some embodiments of the present disclosure, the conductive member 500 may be separately formed, rather than being formed through the same patterning process as the electrodes of the electroluminescent device 200, so that the thickness of the conductive member 500 may be set according to actual needs, thereby realizing a microcavity structure design for the electroluminescent device 200.

Referring back to FIG. 4, the display substrate may include a plurality of electroluminescent devices 200, for example, one electroluminescent device 200 may be disposed in each of the pixels PX1, PX2, and PX3. As shown in FIG. 4, the electroluminescent device 200 in the pixel PX1 includes a second electrode 220A, the electroluminescent device 200 in the pixel PX2 includes a second electrode 220B, and the electroluminescent device 200 in the pixel PX3 includes a second electrode 220C. The conductive member 500A electrically connects the conductor portion 326A with the second electrode 220A; the conductive member 500B electrically connects the conductor portion 326B with the second electrode 220B; and the conductive member 500C electrically connects the conductor portion 326C with the second electrode 220C. That is, the display substrate may include a plurality of contact portions 10, each of which is located in the transmission area 120.

For example, the plurality of electroluminescent devices 200 may share one second electrode 220 and one light-emitting layer 230. For example, the second electrodes 220A, 220B, 220C may be a common electrode having a unitary structure that may cover both the emission area 110 and the transmission area 120. Alternatively, the common electrode may be formed only in the emission area 110. Since the first electrodes 210 of the plurality of electroluminescent devices are separated from each other and electrically connected to different thin film transistors, even if the second electrodes of the plurality of electroluminescent devices are a common electrode, a plurality of electroluminescent devices may be separately controlled to emit light. Thereby, the structure of the display substrate may be further simplified, the manufacturing process may be simplified, the production efficiency may be improved, and the production cost may be reduced.

Figure 7:
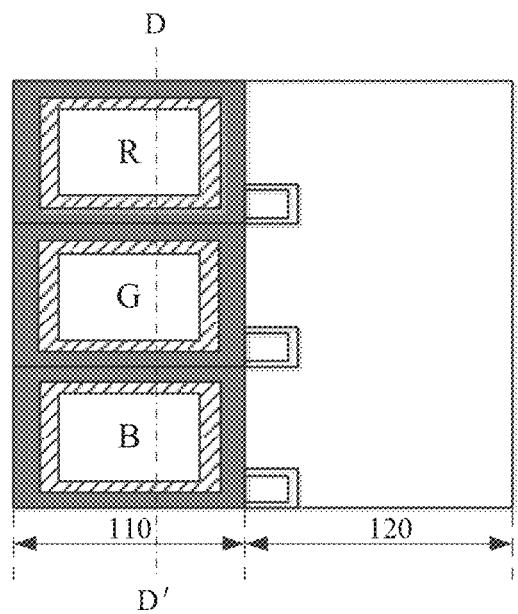
FIG. 7 is a layout view schematically showing a unit area of a display panel or a display device according to some exemplary embodiments of the present disclosure.
Figure 8:
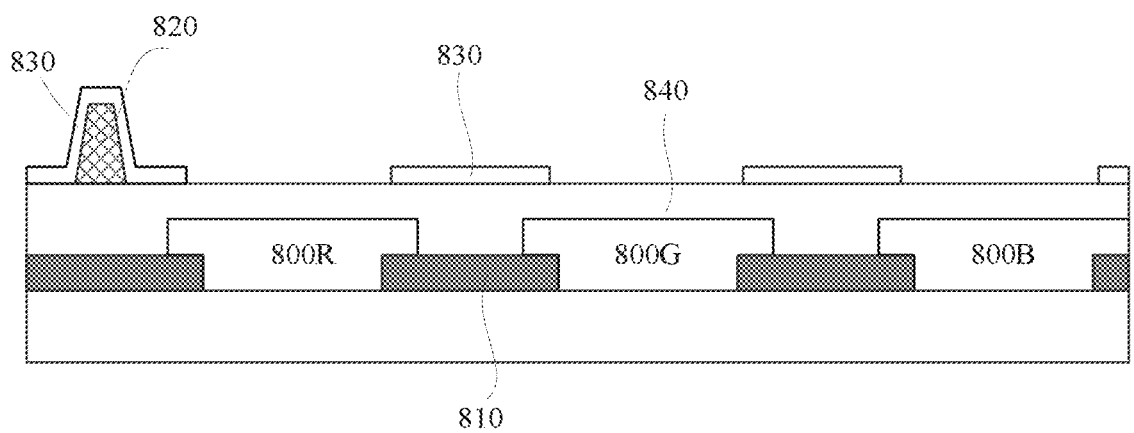
FIG. 8 is a schematic cross-sectional view of a color filter cover taken along line DD' in FIG. 7 according to some exemplary embodiments of the present disclosure.

According to some embodiments of the present disclosure, when the display substrate is used to form a display panel or a display device, it is required to match a color filter cover to realize a display function. FIG. 7 schematically illustrates a layout view of a unit area of a display panel or a display device according to some exemplary embodiments of the present disclosure, and FIG. 8 is a schematic cross-sectional view of a color filter cover taken along line DD' in FIG. 7 according to some exemplary embodiments of the present disclosure. Referring to FIGS. 7 and 8, the color filter cover may include filters ("800R", "800G", "800B" as shown in FIG. 8), a black matrix 810, a protective layer 840, and an auxiliary electrode 830. For example, "800R" is a red filter, "800G" is a green filter, and "800B" is a blue filter. The color filter cover may be disposed opposite to the display substrate as described above, for example, by alignment and assembly, to form a display panel. The auxiliary electrode 830 may be in contact with the second electrode 220 of the display substrate. Since the transmission area 120 is also provided with the second electrode 220, that is, the second electrode 220 is of an entire layer structure, it is not required to strictly define the structure (including materials, specific shapes, and thicknesses) of the auxiliary electrode 830 of the color filter cover. Thus, the display substrate is applicable to any color filter cover which is formed through different color filter cover processes based on laminated structure design. For example, a plurality of spaced-apart auxiliary electrodes 830 may be formed on the color filter cover, and the auxiliary electrodes 830 may also cover a spacer 820. According to some embodiments of the present disclosure, a line width of any layer of the filter, the black matrix, the protective layer or the auxiliary electrode may be changed according to a structure of the display substrate. According to some specific embodiments of the present disclosure, when the first electrode 210 is an anode and the second electrode 220 is a cathode, the auxiliary electrode may be an auxiliary cathode. Thereby, the performance of the display panel and the performance of the display device formed based on the display substrate and the color filter cover may both be further improved.

In another aspect of the present disclosure, embodiments of the present disclosure provide a method of manufacturing a display substrate. The display substrate manufactured by the method may be the display substrate as described above, and thus, all the features and advantages of the display substrate as described above may be included in the method, and details are not described herein again. In general, the method has the advantages of simple process, high production efficiency and low manufacturing cost. Further, the display substrate manufactured by the method may realize the electrical connection between the electroluminescent device and the thin film transistor without etching out the via holes. Thus, on one hand, the manufacturing process may be simplified; on the other hand, the electrical connection between the electroluminescent device and the thin film transistor is realized by means of the contact portion which has a large transparency so that the overall transparency of the display substrate is improved while the display substrate has a large aperture ratio, a large illuminating area and high luminous efficiency, that is, both the transparency and the luminous efficiency of the display substrate are taken into consideration, thereby further improving the market competitiveness of the product.

Figure 9:
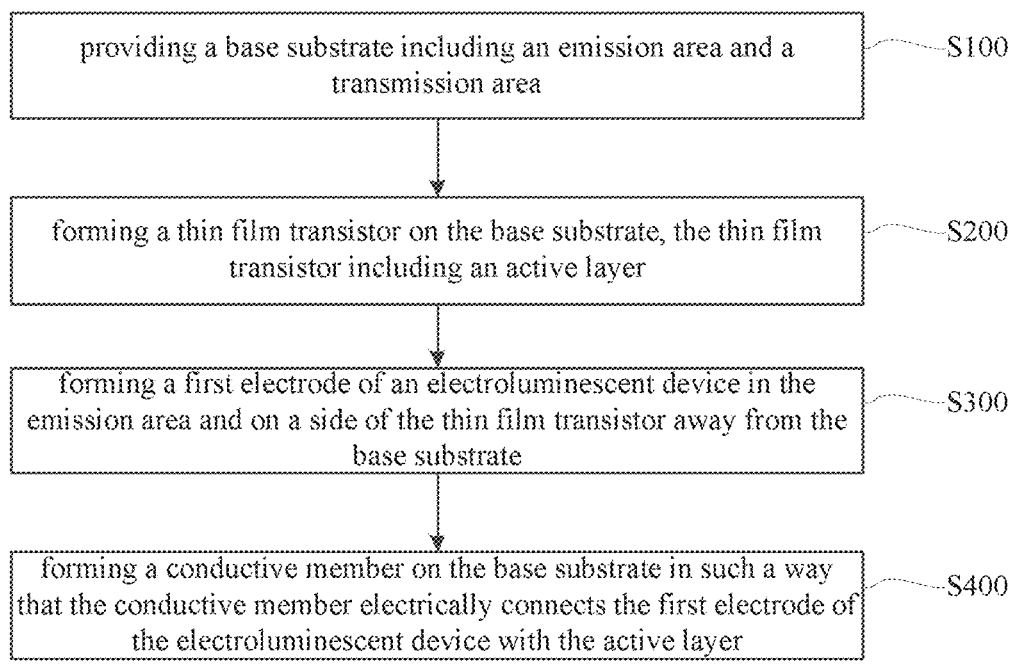
FIG. 9 is a flowchart of a method of manufacturing a display substrate according to some exemplary embodiments of the present disclosure.

According to some embodiments of the present disclosure, referring to FIG. 9, a method of manufacturing a display substrate according to some embodiments of the present disclosure may include:

S100: providing a base substrate including an emission area and a transmission area;

S200: forming a thin film transistor on the base substrate, the thin film transistor including an active layer;

S300: forming a first electrode of an electroluminescent device in the emission area and on a side of the thin film transistor away from the base substrate; and S400: forming a conductive member on the base substrate in such a way that the conductive member electrically connects the first electrode of the electroluminescent device with the active layer, wherein the conductive member has a contact portion in contact with the active layer, and the contact portion is located in the transmission area.

Figure 10A:
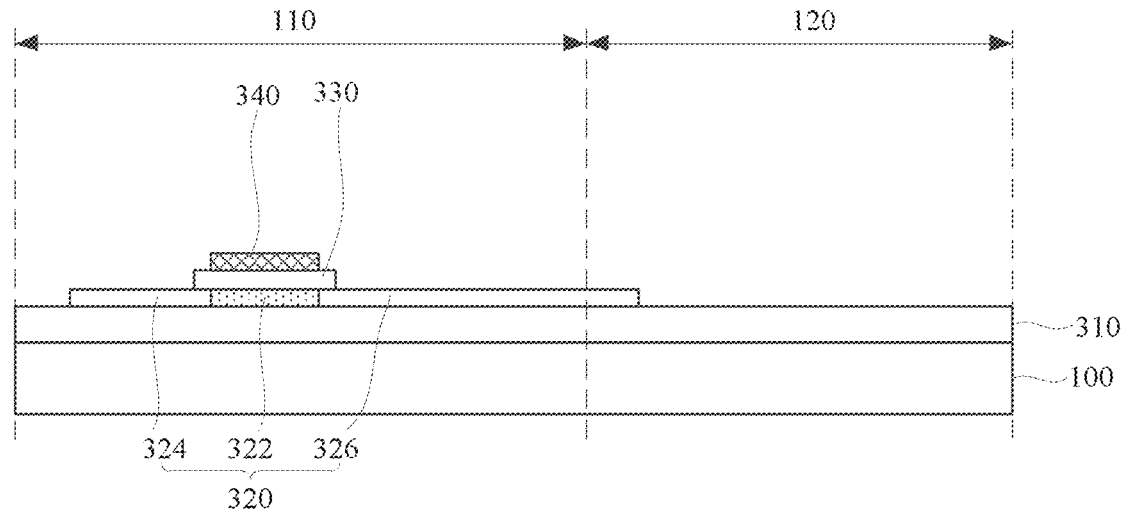
FIG. 10A-FIG. 10E are schematic views showing cross-sectional structures formed after various steps in a method of manufacturing a display substrate according to some exemplary embodiments of the present disclosure are performed.

Specifically, referring to FIG. 10A, the base substrate 100 includes an emission area 110 and a transmission area 120. A buffer layer 310 is formed on the base substrate 100, and the buffer layer 310 may cover both the emission area 110 and the transmission area 120. For example, the base substrate 100 (e.g., glass substrate) may be cleaned, and a buffer layer material may be deposited on an entire surface of the base substrate 100 to form the buffer layer 310.

With further reference to FIG. 10A, an active layer 320 is formed on a side of the buffer layer 310 away from the base substrate 100. For example, a semiconductor material may be deposited on an entire surface of the buffer layer 310 away from the base substrate 100, and then is patterned to form an active layer pattern through a patterning process. A gate insulating layer 330 is formed on a side of the active layer 320 away from the buffer layer 310, and a gate electrode 340 is formed on a side of the gate insulating layer 330 away from the active layer 320. Specifically, a gate insulating layer material and a gate material may be successively deposited and patterned to form the gate insulating layer 330 and the gate electrode 340 through a patterning process. Then, portions of the active layer 320 that are not covered by the gate electrode 340 may be treated to form conductors through a self-alignment process, such that the active layer 320 includes the channel portion 322 and the conductor portions 324, 326 on opposite sides of the channel portion 322. The conductive member 500 formed in a subsequent step contacts the conductor portion 326 and covers the part of the conductor portion 326 distal to the channel portion 322. That is, the channel portion 322 of the active layer and the conductor portions 324, 326 of the active layer are disposed in the same layer, and the conductor portions 324, 326 may be formed of a conductive active layer material such as indium gallium zinc oxide. Thereby, the channel portion 322 and the conductor portions 324, 326 of the active layer may be easily formed, which further simplifies the manufacturing process and improves production efficiency.

Figure 10B:
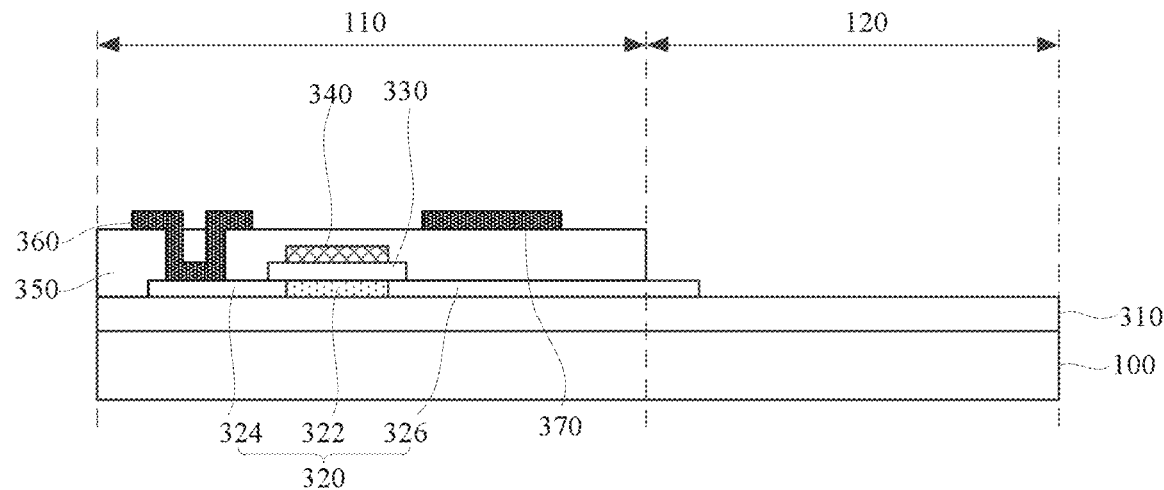

Referring to FIG. 10B, an interlayer dielectric layer 350 is formed on a side of the gate electrode 340 away from the gate insulating layer 330, and a via hole is formed in the interlayer dielectric layer 350. Specifically, the interlayer dielectric layer 350 and the via holes may be formed by depositing interlayer dielectric layer material and etching out the via hole. It should be noted that if the transparency satisfies the requirement, the interlayer dielectric layer in the transmission area may not be etched away.

With further reference to FIG. 10B, a metal layer is deposited on a side of the interlayer dielectric layer 350 away from the gate electrode 340, and is patterned to form a source electrode 360 and a capacitor electrode 370. The source electrode 360 is electrically connected to the conductor portion 324 of the active layer and further to the channel portion 322, through a conductive plug formed in the via hole in the interlayer dielectric layer 350.

Figure 10C:
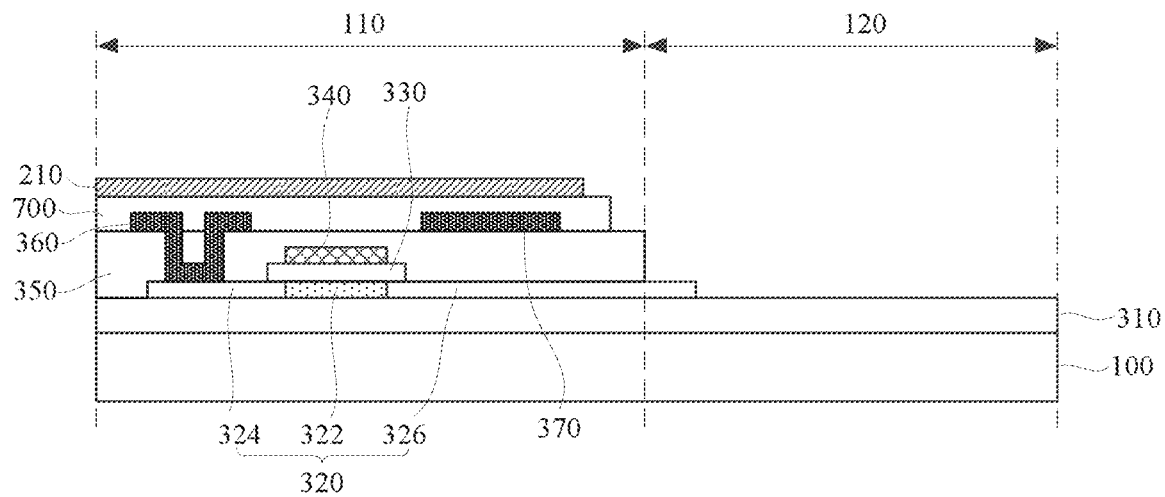

Referring to FIG. 10C, an insulating layer 700 is formed on a side of the source electrode 360 and the capacitor electrode 370 away from the interlayer dielectric layer 350. The insulating layer 700 may further include a passivation layer disposed on a side of the source electrode 360 away from the interlayer dielectric layer 350 and a planarization layer disposed on a side of the passivation layer away from the source electrode 360. Specifically, passivation layer material and planarization layer material (such as resin) may be deposited on an entire surface, and patterned in such a way that the planarization layer material is absent in the transmission area 120 and the passivation layer material exposed in the transmission area 120 is etched away, so as to form the passivation layer and the planarization layer. Thereby, the insulating mediums in the transmission area are removed, which helps to increase the transparency of the transmission area and further increase the overall transparency of the display substrate.

The method of manufacturing the thin film transistor is simple in process and simplifies the structure of the transmission area. In the processes of manufacturing the thin film transistor 300, the inorganic and organic insulating mediums in the transmission area 120, such as the interlayer dielectric layer 350 and the insulating layer 700 (including the passivation layer and the planarization layer), are removed, thereby helping to increase the transparency of the transmission area and further increase the transparency of the display substrate.

Then, a part of structures of the electroluminescent device 200 may be formed firstly. For example, referring to FIG. 10D, a reflective metal (or a stacked structure thereof) is deposited on a side of the insulating layer 700 away from the base substrate 100 and patterned to form the first electrode 210. The steps of forming the structures other than the first electrode 210 of the electroluminescent device 200, for example, forming the light-emitting layer 230 and the second electrode 220 may be performed after the conductive member 500 and the pixel defining structure 600 are formed.

Figure 10D:
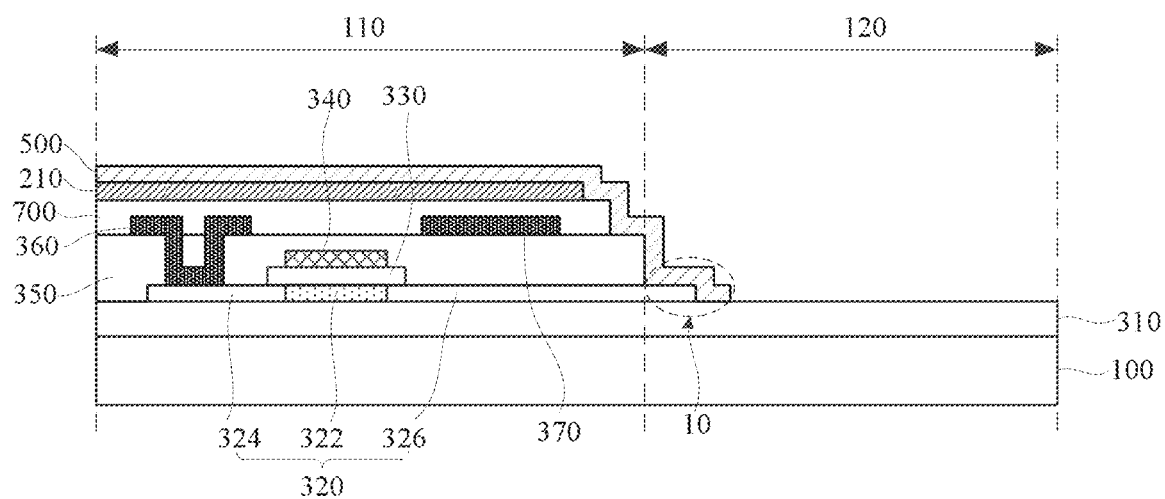

Referring to FIG. 10D, the conductive member 500 is formed in such a way that the conductive member 500 is brought into contact with the active layer 320 of the thin film transistor 300 and the contact portion 10 is covered by the pixel defining structure 600.

In this step, referring to FIG. 10D, the conductive member 500 electrically connected to the electrode 210 of the electroluminescent device 200 is formed on the base substrate 100, and the conductive member 500 is brought into contact with the active layer of the thin film transistor 300, and the contact portion 10 is covered by the pixel defining structure 600. Therefore, the formed conductive member may be easily connected to the active layer, and the process is simple. Also, it is not necessary to form the electrical connection by means of the via holes in the emission area 110, thereby avoiding small aperture ratio and low transparency caused by the via holes. Specifically, the conductive member 500 may contact the conductor portion 326 of the active layer. According to some embodiments of the present disclosure, the conductive member 500 is formed by depositing transparent conductive material, and the conductive member 500 may cover the first electrode and the conductor portion 326 in the transmission area 120. Specifically, transparent conductive material (e.g., ITO) may be deposited on a side of the first electrode 210 away from the insulating layer 700 and then be patterned to form the conductive member 500 such that the conductive member 500 covers a part of the transmission area 120 and is in contact with the conductor portion 326. Thereby, the conductor portion may be formed simply, the process may be further simplified, and the production efficiency may be improved. Moreover, the thickness of the conductive member 500 may be easily adjusted according to actual needs, that is, the thickness of the conductive member 500 is adjustable. Specifically, those skilled in the art can adjust the thickness of the conductive member 500 according to microcavity structure design of the display substrate as well as types and colors of the light-emitting layer material, in order to obtain a display substrate having high luminous efficiency. According to some embodiments of the present disclosure, the conductive member 500 has been described in detail above and will not be repeated herein.

With further reference to FIG. 10D, the pixel defining structure 600 covers the contact portion 10 of the conductive member 500 and a part of the conductor portion 326. Specifically, after the conductive member 500 is formed, organic film layer material is deposited to form the pixel defining structure 600. The unnecessary pixel defining structure 600 in the transmission area 120 is removed, thereby helping to increase the transparency of the transmission area 120.

Figure 10E:
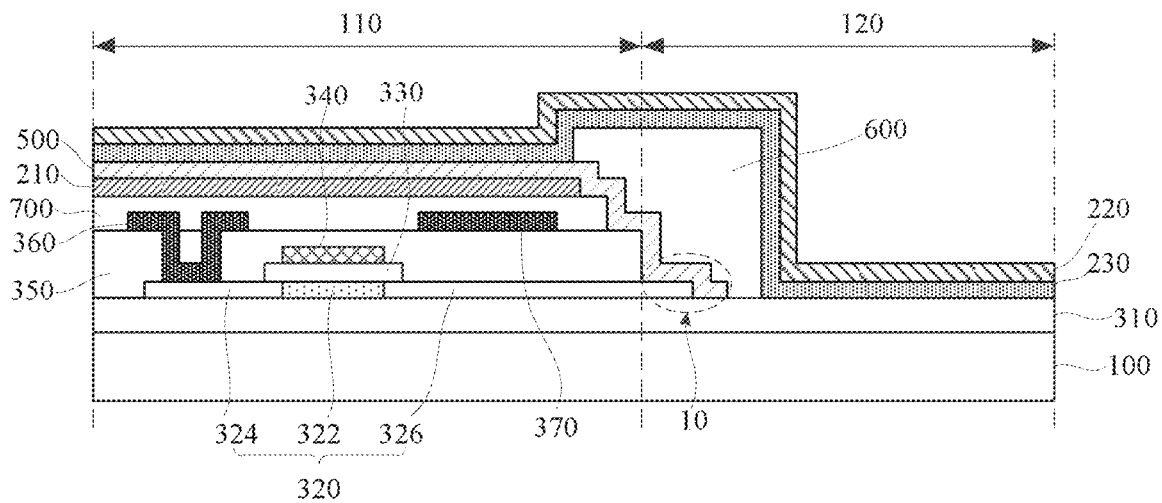

Referring to FIG. 10E, after forming the conductive member 500 and the pixel defining structure 600, the structures other than the first electrode 210 of the electroluminescent device 200 are formed, thereby forming a complete electroluminescent device 200. Specifically, the light-emitting layer 230 is formed on a side of the first electrode 210 away from the base substrate 100, and then the second electrode 220 is formed on a side of the light-emitting layer 230 away from the first electrode 210. For example, organic electroluminescent material may be vacuum-deposited on the entire surface to form the light-emitting layer 230, and transparent conductive material may be deposited on the entire surface to form the second electrode 220, that is, the light-emitting layer 230 and the second electrode 220 may cover both the emission area 110 and the transmission area 120. Thus, in this step, an entire layer of the light-emitting layer and an entire layer of the second electrode may be formed on the base substrate 100 by using an open mask, so that it is not necessary to use a mask of complicated structure such as FMM to form the light-emitting layer and the second electrode, thereby facilitating the manufacturing process of the display substrate. Moreover, as both the transparency of the light-emitting layer 230 and the transparency of the second electrode 220 are large, the transparency of the transmission area 120 is not substantially affected when it is covered by the light-emitting layer 230 and the second electrode 220, and further the overall uniformity of the display substrate may be improved. According to the embodiments of the present disclosure, the first electrode 210, the second electrode 220, and the light-emitting layer 230 have been described in detail above and will not be repeated herein.

In summary, the method has the advantages of simple process, high production efficiency and low manufacturing cost. Further, the display substrate manufactured by the method may realize the electrical connection between the electroluminescent device and the thin film transistor without etching out the via holes. Thus, on one hand, the manufacturing process may be simplified; on the other hand, the electrical connection between the electroluminescent device and the thin film transistor is realized by means of the contact portion which has a large transparency so that the overall transparency of the display substrate is improved while the display substrate has a large aperture ratio, a large illuminating area and high luminous efficiency, that is, both the transparency and the luminous efficiency of the display substrate are taken into consideration, thereby further improving the market competitiveness of the product.

Figure 11:
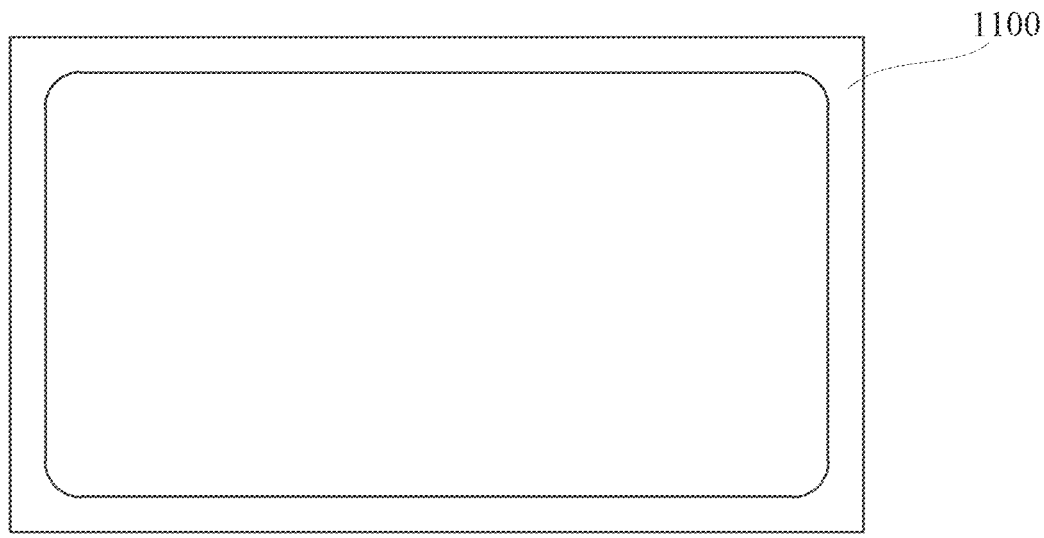
FIG. 11 is a schematic view of a display device according to some exemplary embodiments of the present disclosure.

In still another aspect of the present disclosure, some embodiments of the present disclosure also propose a display device. According to some embodiments of the present disclosure, referring to FIG. 11, the display device 1100 includes the display substrate as described above, or a display substrate manufactured by the method as described above. Thus, the display device may have all of the features and advantages of the display substrate or the method as described above, and will not be repeated again. In general, the display device may realize the electrical connection between the electroluminescent device and the thin film transistor without etching out the via holes. Thus, on one hand, the manufacturing process may be simplified; on the other hand, the electrical connection between the electroluminescent device and the thin film transistor is realized by means of the contact portion which has a large transparency so that the overall transparency of the display substrate is improved while the display substrate has a large aperture ratio, a large illuminating area and high luminous efficiency; that is, both the transparency and the luminous efficiency of the display substrate are taken into consideration, thereby further improving the market competitiveness of the product.

While some embodiments of the present disclosure have been shown and described above, it is to be understood that the foregoing embodiments are illustrative and are not to be construed as limiting the scope of the present disclosure. Variations, modifications, substitutions and changes may be made to these embodiments within the scope of the present disclosure by those skilled in the art. Such variations, modifications, substitutions and changes are intended to fall within the scope of the present disclosure.

What is claimed is:

1. A display substrate comprising:
   a base substrate comprising an emission area and a transmission area;
   an electroluminescent device on the base substrate, the electroluminescent device comprising a first electrode in the emission area;
   a thin film transistor for controlling the electroluminescent device, the thin film transistor comprising an active layer; and
   a conductive member on the base substrate,
   wherein the conductive member electrically connects the first electrode of the electroluminescent device with the active layer, the conductive member comprises a contact portion in contact with the active layer, and the contact portion is located in the transmission area, and
   wherein the active layer comprises a channel portion, a first conductor portion and a second conductor portion, the first conductor portion and the second conductor portion are respectively positioned on opposite sides of the channel portion, an orthographic projection of each of the first conductor portion and the channel portion on the base substrate falls into the emission area, and an orthographic projection of a part of the second conductor portion proximal to the channel portion on the base substrate falls into the emission area, an orthographic projection of a part of the second conductor portion distal to the channel portion on the base substrate falls into the transmission area, and the conductive member is in contact with the part of the second conductor portion distal to the channel portion.

2. The display substrate of claim 1, further comprising a pixel defining structure, wherein the pixel defining structure covers the contact portion.

3. The display substrate of claim 2, wherein the electroluminescent device further comprises:
   a light-emitting layer on a side of the first electrode away from the base substrate; and a second electrode on a side of the light-emitting layer away from the first electrode, wherein the conductive member comprises a conductive layer between the first electrode and the light-emitting layer.

4. The display substrate of claim 3, wherein an orthographic projection of at least one of the light-emitting layer and the second electrode on the base substrate covers an orthographic projection of the conductive member on the base substrate.

5. The display substrate of claim 3, wherein an orthographic projection of at least one of the light-emitting layer and the second electrode on the base substrate covers both the emission area and the transmission area.

6. The display substrate of claim 3, wherein an orthographic projection of at least one of the light-emitting layer and the second electrode on the base substrate covers an orthographic projection of the pixel defining structure on the base substrate.

7. The display substrate of claim 1, wherein an orthographic projection of the conductive member on the base substrate covers an orthographic projection of each of the first electrode and the thin film transistor on the base substrate.

8. The display substrate of claim 1, wherein the thin film transistor further comprises:

a gate insulating layer on a side of the active layer away from the base substrate;

a gate electrode on a side of the gate insulating layer away from the active layer;

an interlayer dielectric layer on a side of the gate electrode away from the gate insulating layer; and a source electrode located on a side of the interlayer dielectric layer away from the gate electrode and electrically connected to the first conductor portion of the active layer, wherein an orthographic projection of each of the gate insulating layer, the gate electrode, the interlayer dielectric layer and the source electrode on the base substrate falls outside the transmission area.

9. The display substrate of claim 8, wherein the display substrate further comprises an insulating layer between the source electrode and the first electrode, wherein an orthographic projection of the insulating layer on the base substrate falls outside the transmission area.

10. The display substrate of claim 9, wherein an area of an overlapped region between the orthographic projection of the insulating layer on the base substrate and an orthographic projection of a pixel defining layer on the base substrate is smaller than an area of an overlapped region between an orthographic projection of the interlayer dielectric layer on the base substrate and the orthographic projection of the pixel defining layer on the base substrate, and the area of the overlapped region between the orthographic projection of the interlayer dielectric layer on the base substrate and the orthographic projection of the pixel defining layer on the base substrate is smaller than an area of an overlapped region between an orthographic projection of the active layer on the base substrate and the orthographic projection of the pixel defining layer on the base substrate.

11. The display substrate of claim 8, further comprising a capacitor electrode, wherein the capacitor electrode is located in the same layer as the source electrode and spaced apart from the source electrode, and an orthographic projection of the capacitor electrode on the base substrate overlaps an orthographic projection of the second conductor portion on the base substrate.

12. The display substrate of claim 1, wherein the conductive member comprises transparent conductive material.

13. The display substrate of claim 1, further comprising a buffer layer between the base substrate and the active layer, wherein an orthographic projection of the buffer layer on the base substrate covers both the emission area and the transmission area.

14. A display device comprising the display substrate of claim 1.

15. A method of manufacturing a display substrate comprising:

providing a base substrate comprising an emission area and a transmission area;

forming a thin film transistor on the base substrate, the thin film transistor comprising an active layer;

forming a first electrode of an electroluminescent device in the emission area and on a side of the thin film transistor away from the base substrate; and forming a conductive member on the base substrate in such a way that the conductive member electrically connects the first electrode of the electroluminescent device with the active layer, wherein the conductive member comprises a contact portion in contact with the active layer, and the contact portion is located in the transmission area wherein forming the thin film transistor on the base substrate comprises: forming the active layer of the thin film transistor on the base substrate, and wherein the active layer comprises a channel portion, a first conductor portion and a second conductor portion, the first conductor portion and the second conductor portion positioned on opposite sides of the channel portion, an orthographic projection of each of the first conductor portion and the channel portion on the base substrate falls into the emission area, and an orthographic projection of a part of the second conductor portion proximal to the channel portion on the base substrate falls into the emission area, an orthographic projection of a part of the second conductor portion distal to the channel portion on the base substrate falls into the transmission area, and the conductive member is in contact with the part of the second conductor portion distal to the channel portion.

16. The method of claim 15, further comprising: forming a pixel defining structure on the base substrate in such a way that the pixel defining structure covers the contact portion.

17. The method of claim 15, further comprising:

forming a light-emitting layer on a side of the conductive member away from the base substrate; and forming a second electrode on a side of the light-emitting layer away from the first electrode, wherein an orthographic projection of at least one of the light-emitting layer and the second electrode on the base substrate covers both the emission area and the transmission area.

18. The method of claim 15, wherein forming the thin film transistor on the base substrate further comprises:

forming a gate insulating layer on a side of the active layer away from the base substrate;

forming a gate electrode on a side of the gate insulating layer away from the active layer;

forming an interlayer dielectric layer on a side of the gate electrode away from the gate insulating layer; and depositing a metal layer on a side of the interlayer dielectric layer away from the gate electrode, and forming a source electrode and a capacitor electrode through a patterning process, wherein an orthographic projection of each of the gate insulating layer, the gate electrode, the interlayer dielectric layer, the source electrode and the capacitor electrode on the base substrate falls outside the transmission area.

* * * * *